United States Patent [19]
Whetstone et al.

[11] 3,956,588
[45] May 11, 1976

[54] DIGITIZING GRAPHIC SYSTEM USING MAGNETOSTRICTIVE TRANSDUCERS

[75] Inventors: Albert L. Whetstone, Southport; Stanley C. Phillips, Trumbull, both of Conn.

[73] Assignee: Summagraphics Corporation, Fairfield, Conn.

[22] Filed: July 12, 1974

[21] Appl. No.: 487,982

[52] U.S. Cl. .................................. 178/19; 33/1 M; 340/347 AD
[51] Int. Cl.² ........................................ G08C 21/00
[58] Field of Search ................. 340/347 P, 347 AD; 178/18, 19; 73/DIG. 2; 33/1 M; 333/30 M

[56] References Cited
UNITED STATES PATENTS

| | | | |
|---|---|---|---|
| 3,016,498 | 1/1962 | Powell............................. | 330/30 M |
| 3,022,501 | 2/1962 | Seigle................................ | 178/18 X |
| 3,347,986 | 10/1967 | Gilbert................................ | 178/18 |
| 3,379,834 | 4/1968 | Conners.............................. | 178/18 |
| 3,475,705 | 10/1969 | Lindemann ...................... | 330/30 M |
| 3,561,125 | 2/1971 | Zeidler............................... | 33/1 M |
| 3,648,277 | 3/1972 | Whetstone et al................ | 178/18 X |
| 3,665,102 | 5/1972 | Townsend et al.................. | 178/18 |
| 3,801,733 | 4/1974 | Bailey ................................. | 178/19 |
| 3,846,580 | 11/1974 | Brenner.............................. | 178/19 |

OTHER PUBLICATIONS
Renwick, "Digital Storage Systems," J. Wiley & Sons, Inc. 1964, pp. 21–24.

*Primary Examiner*—Thomas J. Sloyan
*Attorney, Agent, or Firm*—Daniel M. Rosen

[57] ABSTRACT

A digitizing graphic system including a digitizing area, first and second coordinate arms extendable over the area, first and second magnetostrictive elements each positioned respectively in the first and second coordinate arms. A positionable device is movable with respect to the first and second arms on the area, each of the magnetostrictive elements having associated therewith a sending device and a receiving device. An energizing system is coupled to each of the sending devices for inducing magnetostrictively a strain wave longitudinally propagating along the magnetostrictive element to the respective receiving means. A digitizing system is coupled to each of the sending and receiving devices for digitizing the time duration of the strain wave propagation, the positionable device coupled to each of the coordinate arms for varying the propagating distance along each of the magnetostrictive elements in accordance with the position of the positionable device.

20 Claims, 9 Drawing Figures

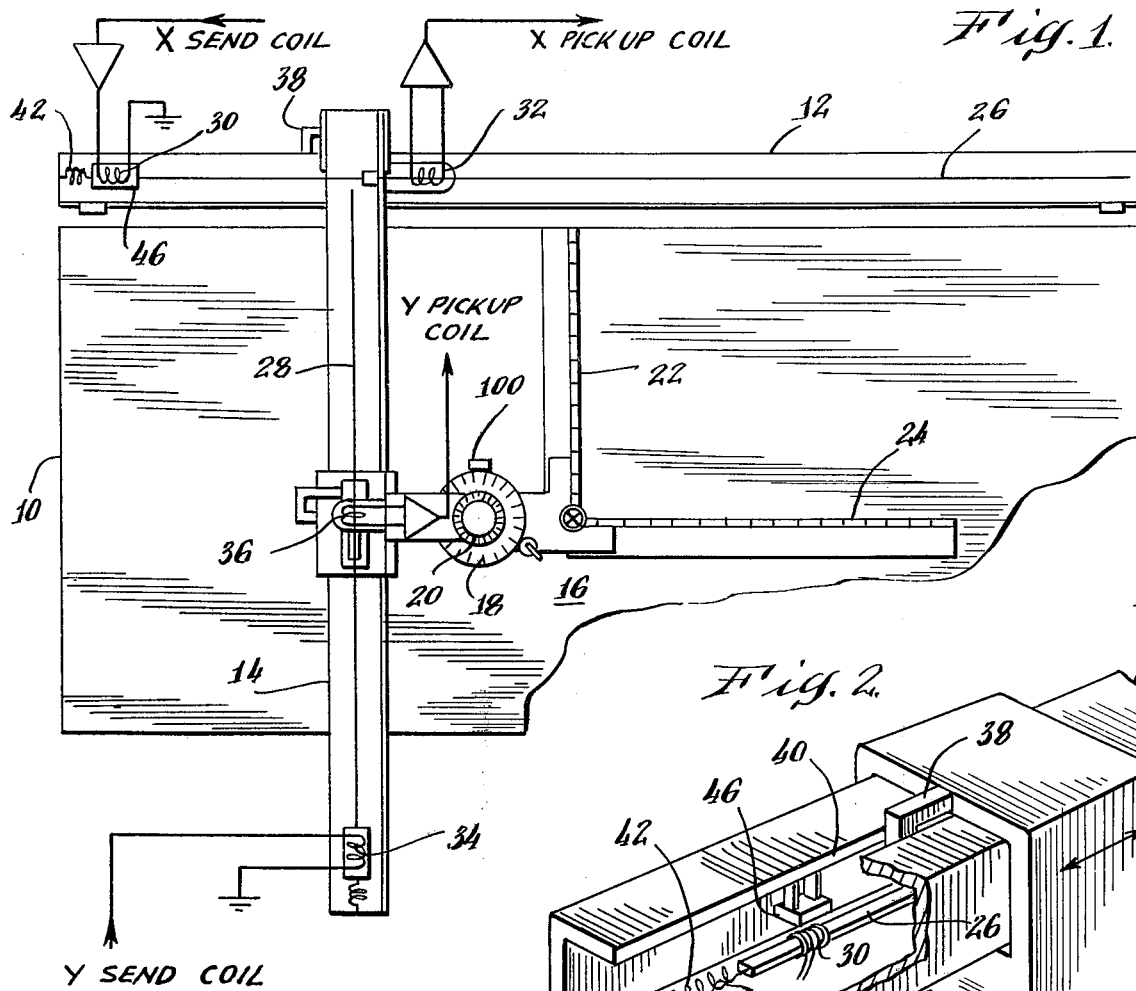
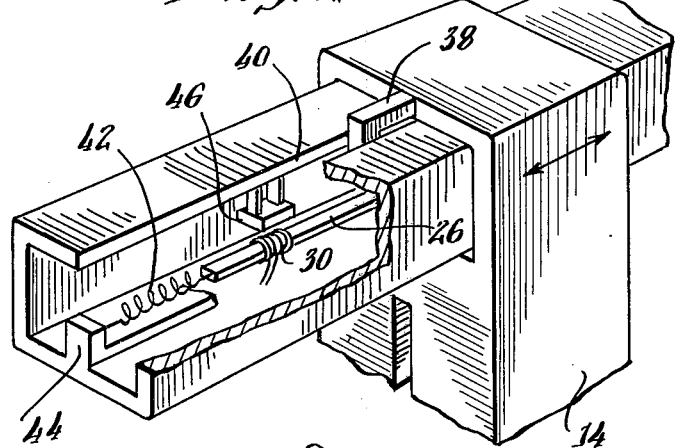
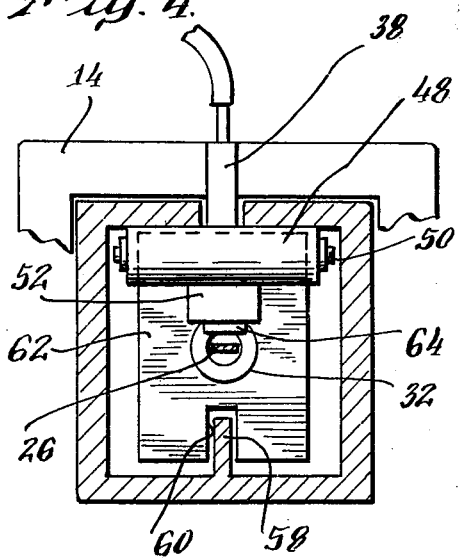
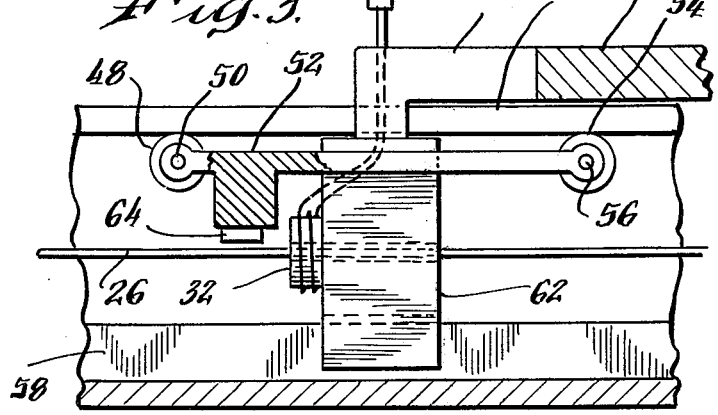

DIGITIZING GRAPHIC SYSTEM USING MAGNETOSTRICTIVE TRANSDUCERS

DRAFTING SYSTEM

This invention relates to drafting systems and more particularly to a drafting system having a digitizing capability.

Conventional drafting systems employ the utilization of a T-square type construction. Such construction employs two arms on a drafting board surface, one across the $x$ axis and one across the $y$ axis. The $x$ axis arm is located horizontally across the top of the board and the $y$ axis arm is slidably mounted at one end thereof to the $x$ axis arm and is capable of moving horizontally across the board along the $x$ axis arm. The $y$ axis movement control is provided by means of a head slidably mounted to the $y$ axis arm and thus capable of movement along the $y$ axis in a vertical direction. For accuracy of drafting, the head includes lineal measuring equipment, such as a graded ruler or the like.

It is desirable when employing such equipment to be able to encode drafted information in digital form. To this end, several methods of encoding the drafted material are known. One such method employs starting with a completed work, scanning same, reducing the scanned data to a digitally usable form, and storing such data in a device such as a computer for use. A more efficient method of operation is to employ encoding techniques directly on the drafting board so that drafting work in progress is actually providing input data in a digital form suitable for use.

Many prior art digitizing systems utilized in conjunction with drafting apparatus employ relatively imprecise and cumbersome forms of position location. For example, prior art systems typically have employed slide wire resistance control employing sliders coupled to $x$ and $y$ drafting coordinates overlaying a drafting board, photo-optical sequencing, shaft angle encoding employing rack and pinion gearing coupled to the $x$ and $y$ arms of the drafting board, and pluralities of switching locations positions along the respective drafting axes, among others. Other methods of digitizing including subsurface detection are inappropriate when dealing with mass-produced drafting systems. In addition, the systems such as described above are complex, expensive, and require extensive conversion to adapt a standard drafting system for encoding purposes.

It is therefore the primary object of the present invention to provide an improved digitizing technique for a drafting system.

It is a further object of the present invention to provide a digitizing technique which may be employed with a conventional drafting board.

It is a further object of the present invention to provide a digitizing system for use with conventional drafting equipment which will be relatively inexpensive to manufacture, easily adaptable, rugged in construction, and which will provide a high degree of reliability and accuracy.

The foregoing objects are realized with the utilization of magnetostrictive phenomena. Magnetostrictively operable devices employing propagation of strain waves are set forth in detail in copending application Ser. No. 312,547, filed Dec. 6, 1972, assigned to the assignee of the present, now U.S. Pat. No. 3,846,580, and the disclosure of which is incorporated herein. In the device disclosed therein, a position determination device is provided with an array of a plurality of transmission media. The transmission media are preferably an array of parallel wires arranged along a horizontal or $x$ axis and a further array of wires arranged along a vertical or $y$ axis. Coordinate location is accomplished by digitizing the time delay required for an induced pulse to transverse the transmission media from a generation point to a reception point. Specifically, a field generating device is positioned in proximity to the surface at a location to be digitized. Further means are provided for triggering the production of a magnetic field by the field generating device, the magnetic field transducing a propagating vibrational mode into the transmission media. Pick-up means are coupled to the transmission media and respond to the propagating vibrational mode for providing a signal to a utilization device which will respond to the means triggering production of the field as well as to the pick-up means in order to provide a position signal corresponding to the time of propagation of the vibrational mode from its time of generation to its time of pick-up. The vibrational mode is effected by means of a strain wave magnetostrictively induced by the magnetic field into the transmission media. The transmission media constitutes a plurality of magnetostrictive wires arrayed along the support surface. The magnetic field generating device may be an individual stylus in the shape of a writing implement or a cursor. The field may be energized by means of a series of pulses or by individual pulses as desired. In further detail, a data digitizer is coupled both to the pick-up and the field generation device for digitizing the time duration between the field generation and the reception by the pick-up device, thus providing a data signal representative of such duration. The duration is actually a measure of the elapsed time required for the strain wave generated to propagate to the pick-up.

The data thus provided may be fed to a computer memory for temporary or permanent storage and will be retrieved when desired. By storing, and later retrieving, the image may be recalled for display on a suitable cathode ray tube or like display device. The data may also be fed directly to a display device by conversion of the digitized signals to analog magnitude and display thereof as a continuous series of signals on the face of the cathode ray tube. The data may also be used to address a memory and thereby be transferred or buffered into any other format. The data may also be transmitted over dedicated or common carrier communications lines.

In accordance with the present invention, and in conjunction with a drafting system, the $x$ and $y$ arms of the drafting board are each provided with a magnetostrictive element, preferably in the form of a magnetostrictive wire, strung along the length of the arm. At one point on the magnetostrictive element is a sending device coupled to the magnetostrictive element in a manner sufficient to induce magnetostrictively a strain wave longitudinally propagating along the length of the magnetostrictive element. At another point along the magnetostrictive element, a pick-up device is positioned. Either the send or pick-up device is positioned so as to be movable with respect to the other in accordance with the movement of the respective $x$ and $y$ arms. By employing time lapse digitization, a digital equivalent of the time delay from the moment of magnetostrictively inducing a strain wave into the element along each of the respective axes until the moment of pick-up by the pick-up device, a suitable digital representation with respect to both x and y of the drafting system may be realized.

Additionally, employing the system described above, it is possible to employ a third axis of digitization, also by means of a magnetostrictive element, this time extending in the desired axial direction, in a third place or coordinate, away from the surface of the drafting area. Thus, it may be possible to encode, in three dimensions, the solid configuration of an article as well as its two-dimensional aspects.

The sending device is preferably fixed mounted while the pick-up is movable in accordance with the movement of the arms of the drafting system. Temperature compensation may be included in the mounting of the magnetostrictive element.

The foregoing objects and brief description of the present invention will become more apparent from the following more detailed description and appended drawings, wherein:

FIG. 1 illustrates the use of a conventional drafting board employing therein the physical concept of the present invention;

FIG. 2 illustrates a detail of the sending mechanism of the present invention;

FIG. 3 illustrates a detail of the structure of the receiving mechanism of the present invention;

FIG. 4 illustrates a left-end view of the structure shown in FIG. 2;

Figure 9:
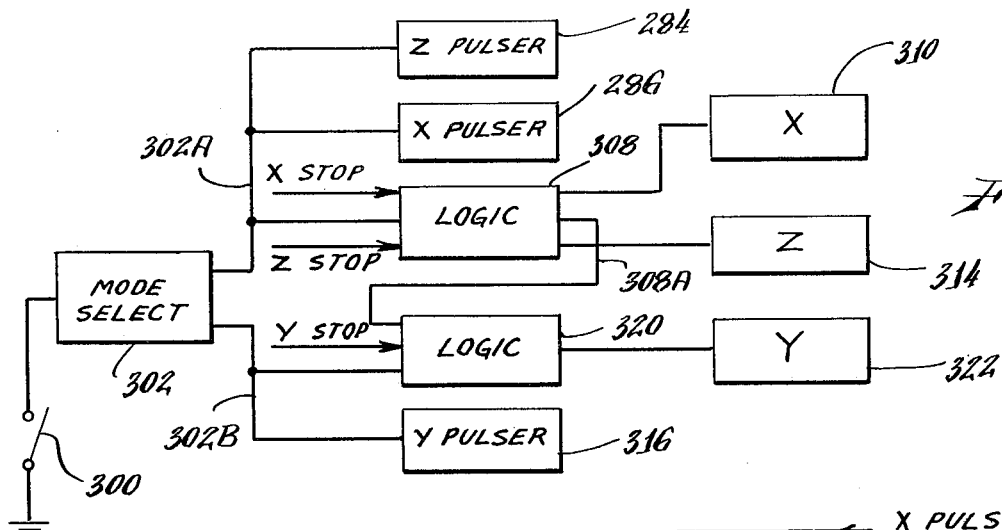
FIG. 9 illustrates the electronic system employed in conjunction with a three coordinate digitizing system.

Referring to FIG. 1, there is shown a typical drafting board configuration employing a board support surface 10 for supporting sheets of paper or other material upon which a drafting operation may be performed. Mounted on the board and utilized in connection therewith is an x axis arm 12 and a y axis arm 14. The x axis arm 12 is fixed mounted along the upper horizontal edge of the board 10. The y axis arm 14 is slidably mounted to the x axis arm 12 so as to permit the y axis arm 14 to traverse the board 10 in a horizontal direction.

Mounted to the y axis arm 14 is a drafting head 16 which includes various functions utilized in drafting. Thus, for example, the head 16 includes a protractor ring 18 surrounding a control knob 20 which may be grasped by the operator. In addition, lineal measuring devices 22 and 24 may be mounted to the head to assist the draftsman in preparing drawings.

The head 16 is also slidably mounted to the y axis arm 14 in a manner permitting the head 16 to traverse the y axis arm 14 in a vertical direction. Thus, movement of the y axis arm along the x axis arm, and movement of the head along the y axis arm, result in x and y coordinate movement of the head 16 in a manner facilitating drafting. The sliding motion of the respective y axis arm 14 and head 16 may be accomplished by means of standard bearing techniques, such as the use of flat face bearing rollers positioned in a lineal carriage or the like. A drafting board such as described hereinabove is commercially obtainable from the Mutoh Industry Ltd. of Evanston, Illinois.

The present invention relies upon the position of the head 16 with respect to the x and y axes for determining a coordinate for digitization. To this end, a magnetostrictive element in the form of a magnetostrictive wire 26 is mounted within the x arm 12 for measuring displacement along the x axis, and a further magnetostrictive element in the form of a magnetostrictive wire 28 is mounted in the y axis arm 14 for determining y axis displacement. As was described above, coordinate location is accomplished by digitizing the time delay required for an induced strain wave to traverse a magnetostrictive element from a generation point to a reception point. As is shown in FIG. 1, the generation means is provided as a fixed coil 30 positioned about one end of the magnetostrictive element 26. A reception means is provided by mounting a pick-up or receiving coil 32 to the upper end of the y axis arm 14 in a manner so as to be coupled to the magnetostrictive element 26.

In a similar manner, a generating means or sending coil 34 is coupled to one end of the magnetostrictive element 28 in the y axis arm 14. A reception means or pick up coil is mounted in conjunction with the head 16 and coupled to the magnetostrictive element 28. In both cases, pick-up coil 32 and pick-up coil 36, each pick-up coil is coupled to the transmission medium defined by the magnetostrictive element and responds to the propagating vibrational mode induced therein for providing a signal to a utilization device which will respond to the means triggering production of the propagating vibrational mode as well as to the coil in order to provide a position signal corresponding to the time of propagation of the vibrational mode from its time of generation to its time of pick-up. It will be evident that the positional coordinates along the x axis will vary as the vertical arm 14 is moved therealong, thereby changing distance between the generating point 30 and the reception point 32. Similarly, the y axis coordinate position will vary as the head 16 is moved vertically along the y axis arm 14, thereby changing the distance between the y axis generating coil 34 and the y axis pick-up coil 36.

It will be understood that the generating and pick-up coil positions may be interchanged, the only criticality being the distance variation therebetween for providing a digitization proportional thereto.

Referring to FIG. 2, the generating point is illustrated in greater detail. Like reference numerals are employed for indicating like components where appropriate. As shown in FIG. 2, the y axis arm 14 is slidable along the x axis arm 12 by means of suitable bearings positioned between the interior surfaces in a conventional manner and not shown. The pick-up coil 32 shown in FIG. 1 is mounted to the y axis arm 14 by means of a suitable link 38 which will be described in further detail in connection with FIGS. 3 and 4.

The construction of each of the x and y arms provides for a slot traversing the length of one side thereof for accommodating the link holding the respective pick-up coils. Thus, the link 38 is adapted to slide within the opening provided by the slot 40 along the upper side of the x axis arm 12. The view shown in FIG. 2 would be that normally invisible from the top portion of the drafting system.

The magnetostrictive element 26, which is in the form of a wire having a rectangular cross-section, is mounted to the x axis arm 12 by means of a coil spring 42 which is soldered or otherwise suitably bonded to the end of the magnetostrictive element 26 at one end thereof and affixed by means of soldering or suitable bonding at the other end thereof to an upstanding leg portion 44. The upstanding leg 44 may be formed as part of the x axis arm 12 or may be physically attached thereto by suitable adhesive means. The magnetostrictive element 26 is thus mounted at both ends of the x axis arm in a manner sufficient to maintain the magnetostrictive element 26 in tension but without undue tensile force thereon. The function of the spring 42 is to ensure that the proper tension will remain on the magnetostrictive element 26 and thereby compensate for temperature variations which would otherwise cause greater stresses had the magnetostrictive element 26 been physically attached at both ends thereof directly to the frame of the arm 12. The magnetostrictive element may be mounted at both ends by means of such springs, however it is sufficient for only one spring at one end thereof to hold the magnetostrictive element in place and provide the desired temperature compensation. Since magnetostriction is the transmission medium, the elements 26, 28 carry no electrical current. Thus, they may be affixed directly to the arms without concern for electrical isolation or other problems associated with conventional current carrying conductors.

For inducing the propagating strain wave into the magnetostrictive element 26, a sending coil 30 is fixed positioned about a point approximate to the end of the magnetostrictive element 26. Fixably mounted to the upper portion of the arm 12 is a permanent magnet 46 which overlies the position of the sending coil 30. The use of the permanent magnet 46 provides a magnetic bias thereby increasing the flux density in the vicinity of the sending coil. Increasing the flux density about the sending coil will serve to increase the magnitude of the vibrational mode induced magnetostrictively into the magnetostrictive element 26. It will be appreciated however that the biasing magnet 46 is not essential and that the magnetostrictive element may be premagnetized to a remanent condition to provide a flux level sufficient to establish the signal level desired. Alternatively, it is possible to utilize pick-up circuitry sufficiently sensitive to discriminate between signal and noise levels in a manner such that the use of the magnet is not necessary.

The construction of the y axis arm 14 at the lower end thereof is precisely the same as that shown for the x axis arm. It should also be noted that the spring 42, although shown at the end of the magnetostrictive element containing the sending coil, need not be positioned at that point but may be positioned at the opposite end of the respective axis arm. The magnetostrictive element in the y axis arm 14 terminates in a similar manner at a point in the y axis arm 14 corresponding to the termination thereof at the x axis arm 12.

Referring now to FIG. 3, the receiving means including the pick-up coil affiliated with the x axis is illustrated in greater detail. As shown, a trolley arrangement is employed for causing the pick-up coil 32 to traverse the magnetostrictive element 26. The trolley structure consists essentially of a first roller 48 rotatably mounted about a central shaft 50 and in turn mounted to a support surface 52. A second roller 54 is mounted about a central shaft 56 and in turn coupled to the support surface 52. The link 38 mounts to the support surface and serves to maintain the rollers in position against the interior of the framework defined by the x axis arm 12. As shown in FIGS. 3 and 4, the trolley is supported laterally at the other side by an upwardly extending member 58 which mounts into a complementary shaped groove 60 formed within the trolley internal support plate 62. The rollers 48 and 54, the support surface 52 and the support plate 62 may all be manufactured of a suitable plastic or metal material. The pick-up coil 32 is wound about a bobbin which may be manufactured of a plastic or other suitable material. The ends of the leads are fed through the link 38 and away from the arm 12 in a suitable manner sufficient to maintain the wire out of entanglement with the moving parts of the drafting system.

Mounted upon the upper interior side of the support plate 52 is a permanent magnet 64 mounted in proximity with the magnetostrictive element 26. The magnet is mounted so as to extend downward from the support plate 52, thereby maintaining a close relationship with the magnetostrictive element 26. The purpose of this magnet is to insure that the magnetic bias on the magnetostrictive element 26 maintains a smooth and continuous level throughout as the y axis arm causes the trolley structure shown in FIGS. 3 and 4 to traverse the magnetostrictive element 26. It should be noted that, although preferable, the use of this magnet is not essential but will provide a more uniform signal to noise level and without any disturbances that might be caused by a partially destroyed magnetic bias on the magnetostrictive element 26, such as might be caused by environmental effects or the like.

Precisely the same structure is employed for the mechanism of the receiving means and pick-up coil 36 movable in accordance with the movement of the head 16.

By way of illustration, the sending coil may consist of fifty turns of No. 36 gauge enameled copper wire, and the receiving coil may also consist of fifty turns of No. 36 gauge enameled copper wire. It will be understood, that this manner is intended as exemplary only and is not intended to be limiting. Various numbers of turns may be employed in accordance with the sensitivity of the pick-up instruments and the strength of the signals generated.

Figure 5:
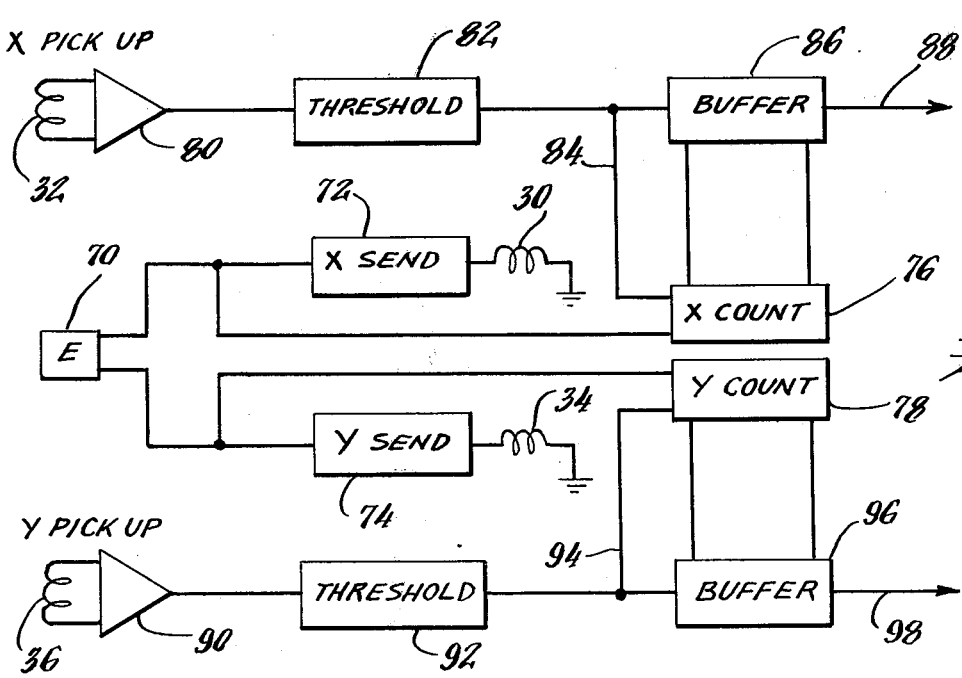
FIG. 5 is a general block diagram of the electronic system employable with the present invention.

Referring now to FIG. 5, a simplified block diagram illustrating the operation of the digitizing of the present invention is shown. The explanation of magnetostrictively generated signals as propagating strain waves vibrating in a longitudinal mode along the length of the magnetostrictive element is fully set forth in the aforementioned U.S. Pat. No. 3,846,580, the disclosure of which is incorporated herein by reference.

When the digitization operation is desired, the appropriate energization is provided by switches, logic circuitry and the like indicated generally as the block 70 to the x sending circuitry 72 and to the y sending circuitry 74. The energizing signals may be provided simultaneously or sequentially to the x and y sending circuitry. The x sending circuitry 72 provides an appropriately configured and sized signal to the x sending coil 30. Similarly, the y sending circuit 74 provides a similar signal to the y sending coil 34. At the same time, the signal provided by the circuit block 70 also initiates a count in the x counter 76. The energization for the y sending circuit 74 provides a signal initiating a y count in the y counter 78. Taking the x signal first, when the propagating strain wave reaches the x pick-up coil 32 and is sensed by an appropriate sense amplifier 80, and discriminated over noise by means of a thresholding circuit 82, an appropriate signal is provided along the line 84 to stop the digitization of the $x$ counter 76. At this point, the count in the $x$ counter 76 represents a digitized version of the time delay required for the propagating strain wave to traverse the magnetostrictive element from the send coil 30 to the pick-up coil 32. At the same time, the signal emerging from the threshold circuit 82 may be employed to energize a buffer 86 causing the count in the $x$ counter 76 to be transferred through the buffer 86 and along an output line 88 for utilization in an appropriate output device.

Similarly, when an energization signal activates the $y$ sending circuit 74 and initiates a $y$ count in the $y$ counter 78, the propagating strain wave will traverse the $y$ axis magnetostrictive element 28 till reaching the $y$ pick-up coil 36 where it will be transduced and sensed by a sense amplifier 90. After being discriminated in a thresholding device 92 over noise signals, a signal will be applied along the line 94 to the $y$ counter, thereby halting the digitization therein. At the same time, a signal may be applied to the buffer circuit 96 causing the count now stored in the $y$ counter 78 to be transferred along the output line 98 for utilization in an appropriate output device.

The passage of a signal along the output line 88 may be employed to reset the $x$ counter 76, whereas the passage of a signal along the output line 98 may be employed to reset the $y$ counter 78. Thus, both $x$ and $y$ counters may be reset for the next digitizing operation.

Figure 6:
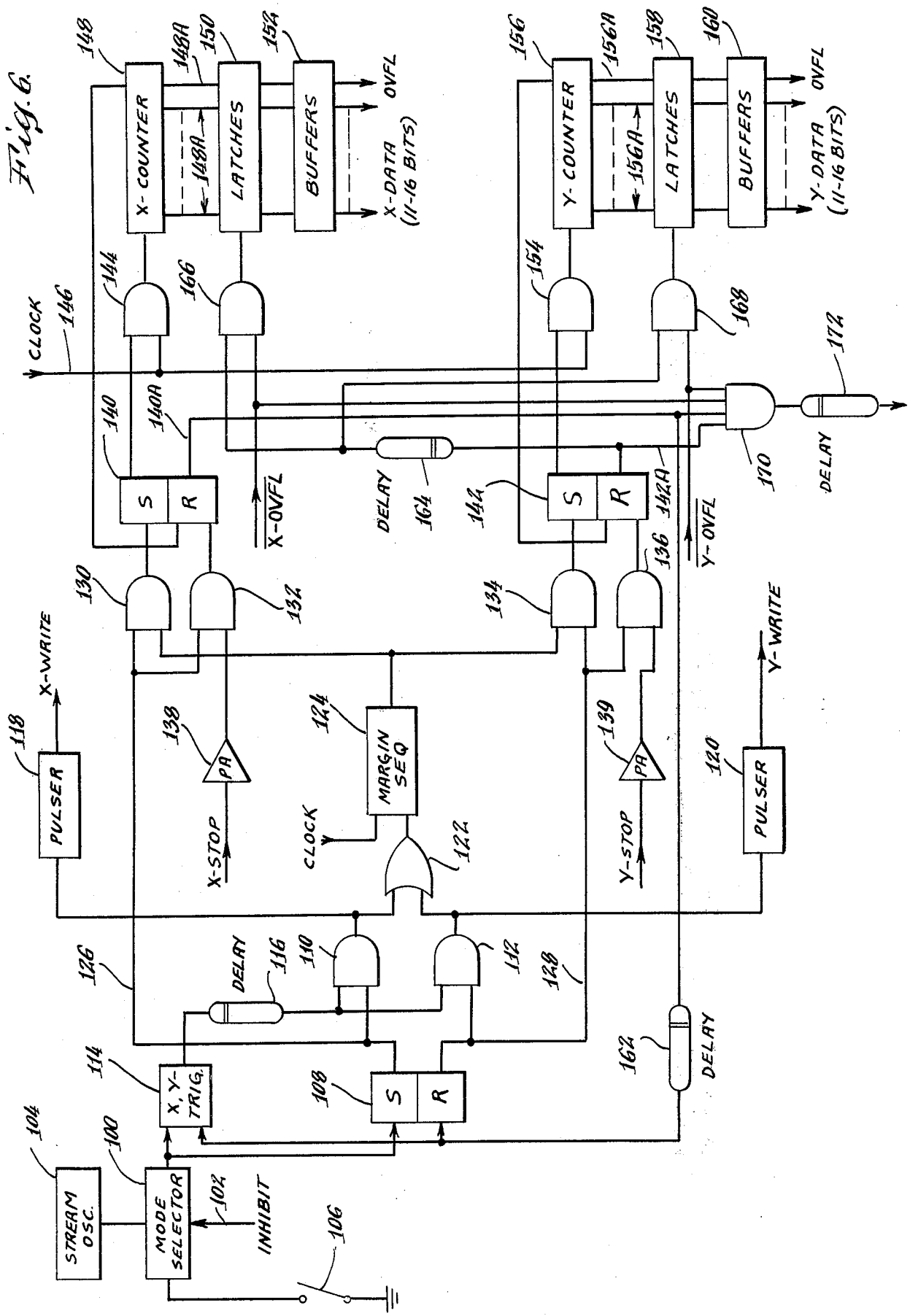
FIG. 6 is a more detailed circuit diagram of FIG. 5.

Referring now to FIG. 6, the utilization of the present invention in conjunction with more detailed suitable circuitry is illustrated in schematic form. The logic circuitry possesses the capability to operate the data digitization in a variety of modes. Thus it may be desirable to operate on a point by point basis digitizing each point, as with a push button mounted on the head 16, on the drafting surface. It alternatively may be desirable to continuously encode as the head is moved about the surface. In either event, a mode selector 100 is illustrated with the appropriate external controls (not shown) for selecting either single bit or multiple bit data digitization as desired. A logic inhibit input line 102 is provided to the mode selector to prevent the mode selector from operating under certain conditions which will be described in further detail below. Coupled to the mode selector is a source of data pulses 104 which may be provided from a suitable stream oscillating or pulse generating device. The head 16 is provided with a switch 106 which may be used by the operator either to signal proximity with the data surface or to otherwise energize the mode selector for providing the oscillations indicating generation of pulse at a desired moment of data digitization. The pulse thus provided from the mode selector 100 is coupled to a triggerable flip flop 108 and thence to a first and second AND gate set 110 and 112. The output of the mode selector 100 is also coupled to a mono-stable vibrator or one shot 114, and, in turn, to a delay 116 which is coupled in turn to the other input of the AND gate set 110 and 112.

The outputs of the gates 110 and 112 are coupled to respective $x$ and $y$ pulsers 118 and 120, for providing the $x$ and $y$ pulses along the field generating lines 26 and 28 as shown in FIG. 1. These outputs are also connected to the input of an OR gate 122 which, in turn, couples the outputs of the gates 110 and 112 to a margin sequencing device 124. Depending upon the activation of the triggerable flip flop 108, a suitable energization has been provided along the $x$ permit line 126 or the $y$ permit line 128 for energizing either of the gates 130, 132, 134 or 136 in accordance with the output of the margin sequence circuit 124. Depending upon the activation, an $x/y$ stop signal will pass the preamplifiers 138, 139, and be coupled to alternative inputs of either of the gates 132 or 136 for triggering triggerable flip flops 140 or 142 respectively. The margin sequencing circuit is merely an adjustable delay which is employed to fix the point being digitized with respect to the pick-up coils. Thus, if the digitizing point is located at the intersection of the graded rulers at a point "$x$", FIG. 1, then the margin sequencer will add sufficient digitization to both $x$ and $y$ counters accordingly. The point "$x$" can actually be a hairline sight.

The output of the triggerable flip flop 140 is coupled through a logical AND gate 144 in conjunction with a clock pulse, from clock source line 146, to an $x$ counter 148. The output of the $x$ counter is coupled through a latch 150 to a series of buffers 152 for presenting the $x$ axis data in machine usable form, such as either serially or parallel by bit. The output of the triggerable flip flop 142 is coupled through the AND gate 154 in conjunction with the clock pulses provided along the line 146 to the $y$ counter 156 which is in turn coupled through a set of latches 158 to a series of buffers 160 for presenting the $y$ axis digitization data in machine usable form.

The output of the triggerable flip flop 140 is coupled through a further delay 162 to the input of the triggerable flip flop 108 and the one shot circuit 114. The output of the triggerable flip flop 142 is is connected through a further time delay circuit 164 through first and second gates 166 and 168 for providing the transfer signal to the latches 150 and 158 respectively for transferring the $x$ and $y$ data through to the appropriate buffers 156 and 160.

The operation of the circuit in FIG. 6 will now be set forth in further detail. As will be noted in conjunction with the description of FIG. 6, it is necessary for the $x$ and $y$ axis waves to be generated sequentially. Thus, the activation of the control switch 106 will trigger the mode selection to provide a data pulse from the mode selector 100 to the $x/y$ trigger one shot 114 and the triggerable flip flop 108. The action of this pulse is to set the triggerable flip flop 108 and provide a pulse from the output of the triggerable flip flop 108 to the gate 110. The gate 110 will become conditioned upon receipt of the delayed one shot pulse 114 through the delay 116, thereby passing a pulse through the AND gate 110 to the OR gate 122. Passage of the pulse from the output of the gate 110 will activate the pulser 18, thereby resulting in an activation pulse being provided to the $x$ sending coil 30, as shown in FIG. 1. Thus, the digitization sequence along the $x$ axis is begun.

The output of the gate 110 also passes into the gate 122, thereby activating the margin sequencer 124. The output of the triggerable flip flop 108, in providing a pulse along the line 126, primes the gates 130 and 132. As soon as a sufficient time period has gone by, defining the margin sequence timing set into the margin sequencer 124, the margin sequencer 124 passes a pulse through the AND gate which has previously been primed by the output of the triggerable flip flop 108 along the line 126. The resulting output of the AND gate 130 thereby sets a triggerable flip flop 140, providing an output pulse setting the AND gate 144. The clock signals provided along the line 146 thus pass the gate 144 and the x counter 148 begins the x counting digitization corresponding to the propagation of the magnetostrictively induced pulse along the x axis set up by the pulser 118. When the pick-up coil 32 receives the x pulse and transduces an electrical pulse corresponding to the strain wave propagated in the magnetostrictive element 26, an electrical pulse is provided through the preamplifier 138 to the gate 132 which has previously been primed by the pulse along line 126. As a result, the output pulse of the gate 132 serves to reset the triggerable flip flop 140, causing the gate 144 to lose coincidence, and thereby resulting in the x counter ceasing its counting action.

At the same time, the reset output pulse appearing from the output of the triggerable flip flop 140 along the line 140A is passed through the delay unit 162 to the one shot 114 and the triggerable flip flop 108. The delay period of the delay unit 162 is sufficient to allow for any reflections resulting from the inducement of a pulse in the magnetostrictive element to damp out. Appearance of the output pulse from the delay 162 at the input of the triggerable flip flop 108 resets the flip flop 108 causing the output on the reset side of the flip flop 108 to activate the gate 112 while deactivating the gate 110. Activation of the gate 112 gives rise to an output pulse therefrom triggering the pulser 120 thereby setting up a y pulse along the line 28 in the manner as described above in connection with the x digitization. At the same time, the output pulse from the triggerable flip flop 108 proceeds along the line 128 to prime the gates 134 and 136. Upon passage of the pulse through the OR gate 122 from the AND gate 112, thereby activating the margin sequence circuitry for the properly definable margins, the gate 134 becomes activated thereby triggering the triggerable flip flop 142, causing the set output thereof to prime AND gate 154. The other input of the AND gate 154 thus receives the sequential signals along the clock-line 146, thereby permitting the y counter to begin its digitization.

When the induced strain wave along the y axis element 28 (FIG. 1) reaches the pick-up 36, a y stop signal is applied through the preamplifier 138 to the input of the gate 136. As a result, the signal passed through the gate 136 resets the triggerable flip flop 142 thereby rendering the said output of the triggerable flip flop 140 low and disabling the gate 154, thereby resulting in a cessation of digitization in the y counter 156. The reset lines 140A and 142A of the triggerable flip flops 140 and 142 now both being low, and there being no x overflow or y overflow conditions appearing in the x or y counter, the AND gate 170 is thereby activated to provide a data ready signal indicating that the x and y counters have both received their maximum digitization. The data ready signal traverses a delay line 172 which has sufficient delay to enable the signals to be transferred from the x and y counters 148 and 156 through the latches 150 and 158 to the buffers 152 and 160 wherein a data ready signal will enable a data reception unit (not shown) to retrieve the signals from the buffers.

A signal transfer occurs by the provision of output signal along the line 142A indicating completion of the y digitization passing through a delay 164 and thus activating AND gates 166 and 168. If no x or y overflow signals have occurred as a result of overrunning of the counters 148 and 156, the AND gates 166 and 168 pass an appropriate transfer signal to their respective latches 150 and 158, thereby resulting in a transfer of their respective x and y counters 148 and 156 to the buffers 152 and 160 respectively.

If an overflow condition has occurred, an output signal appears along the overflow lines 148A, referring to the x counter 148, or 156A, referring to the y counter 156. The presence of an overflow condition will prevent the appearance of a data ready signal or a transfer of data from x and y counters to the appropriate buffers, and suitable indication on the digitizer control as by means of an audible or visible signal, or both, may be provided.

The completion of the transfer of data through the latches and buffers into a data utilization device by application of a data ready signal also signals the system to initiate its next digitization sequence, thereby repeating the foregoing operation.

Figure 7:
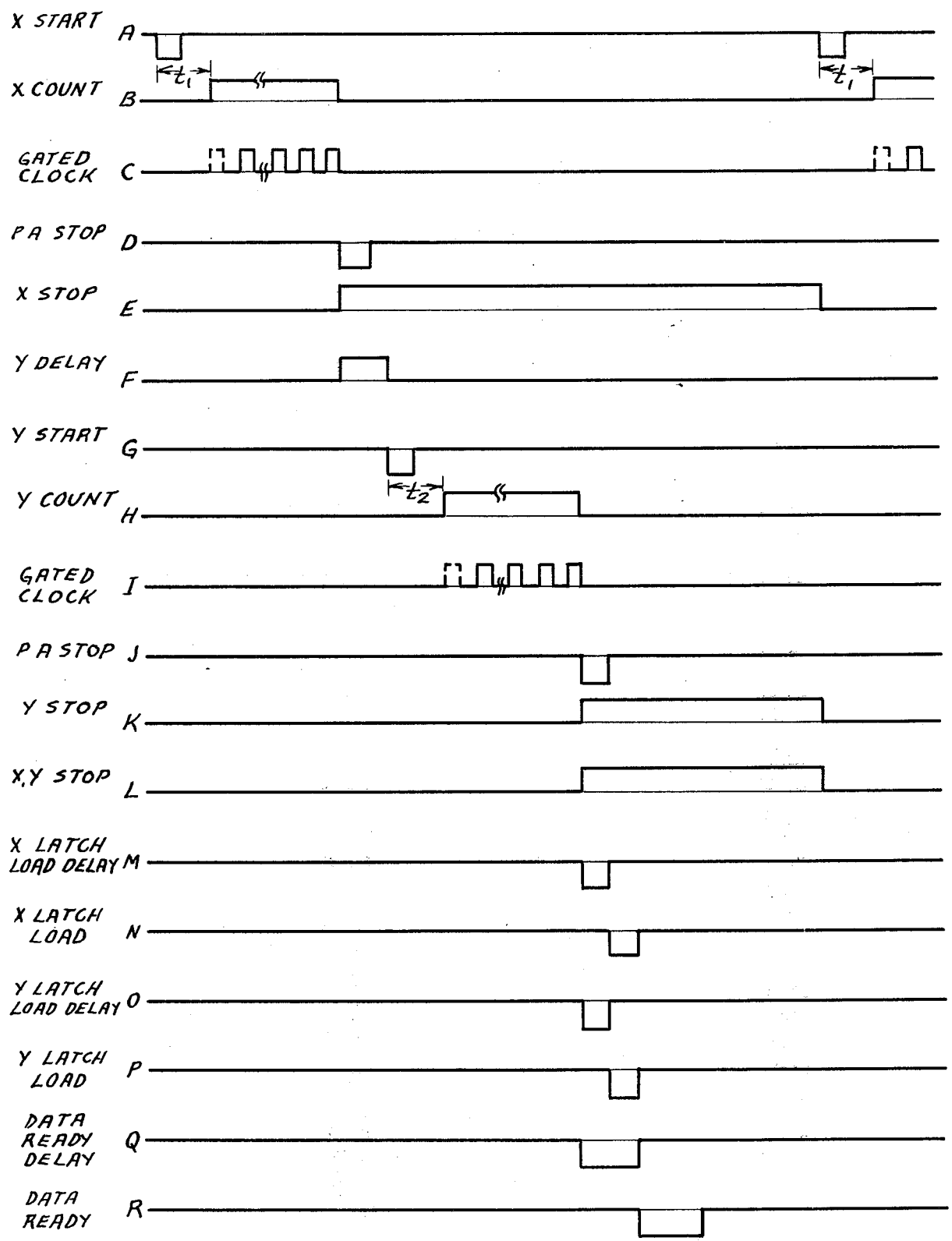
FIG. 7 is a wave form diagram illustrating the graphical relationships of the signals employed in conjunction with the electronic system illustrated in FIG. 6.

Referring to FIG. 7, a timing and waveform diagram illustrative of the relative relationships of the digitization of an x and y coordinate is illustrated. As shown in FIG. 7, the x start pulse is provided along axis a and corresponds to the appearance of a pulse through the pulser 118. The x count pulse along axis b begins after a delay, indicated by timing arrow $t_1$ corresponding to the delay built into the margin sequencer 124. Activation of the x count cycle, representing the setting of the triggered flip flop 140 permits gated clock signals as shown along axis c and appearing along line 146 to accumulate in the x counter. The appearance of a stop signal into the preamplifier 138 is shown on axis d as a short duration pulse. As a result of the short duration preamplifier stop signal, the x stop logic signal as shown along axis e appears as the output of the triggerable flip flop 140. At this time, the resetting of the triggerable flip flop 140 passes along the line 140A through the delay 162, the delay 162 providing a y delay shown along the axis f. At the end of the y delay, the y start pulse shown along axis g is generated through the pulser 120. The delay period indicated by timing arrow $t_2$ also provided by the margin sequencer 124 then opens the triggerable flip flop 142 to permit the y count sequence shown on axis h to pass the gated clock signal shown on axis i along the line 146 through to the y counter. The appearance of the stop signal into the preamplifier 139 results in the short duration pulse shown along the axis j. As a result, a y stop signal indicated along the axis k is generated for effecting the cessation of the count. On resetting of the triggerable flip flop 142 giving rise to the y stop duration pulse along the axis k, the signal passing through the delay 164 sets both the x latch loading and y latch loading cycles. The x load delay is shown along axis m. Upon termination of the x latch load delay, the x latch load signal appears (axis n) as the input signal to the gate 166 to allow transfer of the data from the x counter to the x buffer representing the x digitization. Similarly, the y latch load delay appearing along the axis o results in the y latch load signal appearing along the axis p, representing a signal appearing at the input of gate 168, which results in transfer of the y digitization from the y counter 156 to the buffer 160. Simultaneously, the appearance of the reset signal along the line 142A from the triggerable flip flop 142 has been applied to the gate 170 and held in the data ready delay 172 for a time period evidenced in axis q as being sufficient to encompass both the x and y latch loading cycles. At the end of the data ready delay, a data ready signal as shown along the axis r indicates to the external machine utilization device that data has now been loaded in the $x$ and $y$ buffers and is ready for usage.

Although sequential digitization has been set forth, it will be understood that both $x$ and $y$ coordinates can be simultaneously digitized. A suitable logic circuit for effecting such digitization is set forth in U.S. Pat. No. 3,846,580, assigned to the assignee of the present invention, and the disclosure of which is specifically incorporated by reference.

Figure 8:
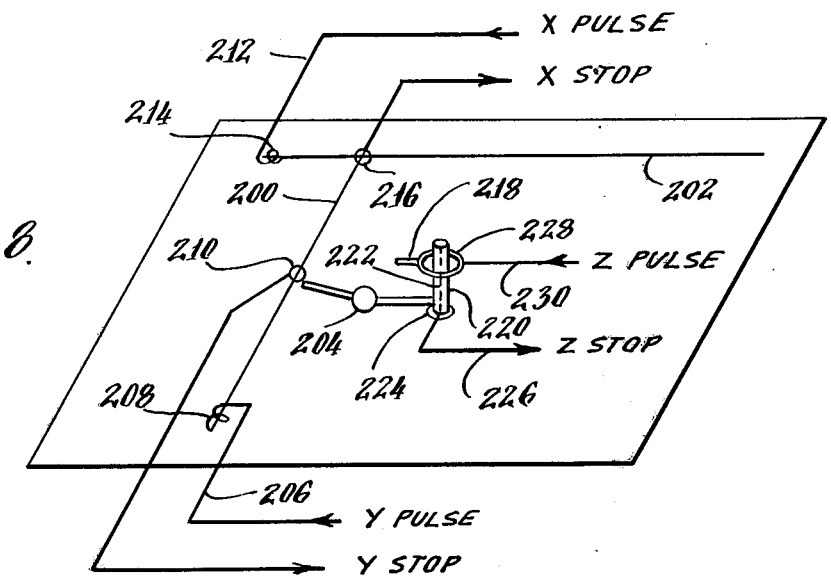
FIG. 8 illustrates employment of the invention utilizing the three dimensional aspect.

Referring to FIG. 8, an embodiment illustrating the manner wherein a three-dimensional digitization may be effected is shown. A surface is provided with magnetostrictive lines 200 and 202 respectively. The representation of FIG. 8 is a schematic representation of the same concept shown in FIG. 1. The head 204 moves vertically along the line 200, as described in connection with FIG. 1, and includes a $y$ pulse line 206, $y$ send coil 208, and pick-up coil 210. The line 200 moves laterally along line 202. The line 202 includes an $x$ pulse line 212, an $x$ send coil 214, and a pick-up coil 216. Biasing magnets may also be present proximate the coils and lines in the manner described in conjunction with FIG. 1, but are not shown in this figure for ease of illustration. The $x$ and $y$ digitizations occur in precisely the manner as described above. The three-dimensional aspect is provided by means of a device for indicating the height of a specific point, thus providing a $z$ axis direction above the surface of the sheet. To this end, a device for digitizing height is shown as including a vertically adjustable pointer 218 mounted on a central shaft 220. The pointer 218 is raisable and lowerable on the shaft 220 in accordance with the particular data point of an object whose height is being measured. The pointer 218 can of course point in any direction desired. The height of the object is determined by means of a magnetostrictive wire 222 which traverses the length of the central shaft 220. At the base of the shaft 220 is a pick-up coil 224 and an exit wire 226. The adjustable mechanism incorporating pointer 218 includes a field generating coil 228, coupled to a $z$ pulse input line 230.

In operation, the pointer 218 is adjusted vertically along the length of the shaft 220 to provide a height in accordacne wth the height of an object at the tip of the pointer 218. Digitization occurs by the provision of a digitizing pulse along the $z$ pulse line 230 to the coil portion 228 of the pointer 218. As a result of the electrical pulse provided in the coil 228, a strain wave is propagated along the magnetostrictive wire 222 located along the central axis of the shaft 200. The strain wave will travel from its point of induction into the wire, at the point corresponding to the height of the pointer 218 above the surface of the data surface. The magnetostrictive pulse will propagate as a strain wave along the wire 222, in the manner described in connection with FIG. 1, as was described above.

At the base of the shaft 220, the pick-up coil 224 responds to the magnetostrictively induced strain wave propagating along the line 222 for transducing therefrom an electrical pulse along the exit line 226.

Magnetostrictive wire such as is described above is more fully described in such use in U.S. Pat. No. 3,846,580, the disclosure of which has been incorporated herein by reference. Such wire is available as a nickel chromium vanadium alloy manufactured by the Wilbur Driver Manufacturing Company of New Jersey, or an alloy known as Permendur, manufactured by the Allegheny Ludlum Corporation of Pittsburgh, Pennsylvania.

Referring now to FIG. 9, a logic circuit for accomplishing the foregoing three-dimensional digitization is illustrated. The logic circuit operates in a manner similar to that described in conjunction with the two-dimensional embodiment illustrated above. A switch 300 is provided for activation and may be located physically in proximity with the pointer 218 illustrated in FIG. 8. A mode select unit 302 operates to channel the energy, simultaneously or sequentially as desired.

Thus, as shown in FIG. 9, the mode selection unit or circuit 302, upon activation through the switch 300, will provide a signal to the upper half of the logic circuit portion consisting of a $z$ pulser 284, the $x$ pulser 286, and the logic circuit 308. Appearance of the signal along the output line 302A of the mode select circuit 302 applies an activation signal to the $z$ pulser 284, the $x$ pulser 286 and energizes the logic 308 to begin the digitizations of the counters corresponding to coordinate positions $x$ and $z$, or counters 310 and 314 respectively. Provisions for margin sequencing may be made in accordance with the circuit described above in connection with FIG. 6. Activation of the $x$ and $z$ pulses will provide the longitudinal line wave along the line 266 (FIG. 8), and will provide an activation signal on coil 278 to the magnetostrictive wire 274 positioned in the $z$ axis shaft 262. When the $x$ stop pulse is received by the logic 308, the counter 310 will shut down. When the $z$ stop pulse is received by the logic 308, the counter 314 will shut down. Thus, counters 310 and 314 will provide digitizations of the $x$ position and $z$ position. Upon completion of the $x$ stop and $z$ stop, an appropriate logic signal is provided along the line 308A in conjunction with the mode selection operation of the mode selection circuit 302. For sequential operation, the mode selection circuit 302 will then supply appropriate energization along the line 302B to a $y$ pulser network 316 and to the logic unit 320. Provision of the logic signal to the logic circuit 320 will activate the $y$ position counter 322. Upon receipt of the $y$ stop pulse, the $y$ digitization counter 322 will stop. Logic 308 and 320 may then provide appropriate transfer signals for translating $x$, $y$ and $z$ data to appropriate usage. An external control may be preset in accordance with the $x$ and $y$ positions to provide a single point along the $xy$ plane corresponding to the central position of the data shaft 262 on the $xy$ surface, whereas the $z$ position will provide an accurate indication of height. Alternatively, the $x$ and $y$ positions may be employed to sense the direction of the pointer in terms of polar coordinates thereby providing an additional dimension of digital data for use by an external utilization device. Thus, the use of magnetostriction has been shown to provide a method whereby three-dimensional data points of $x$, $y$ and $z$ coordinates may be obtained.

Obviously, other combinations of magnetostrictive sheets and wires may be employed to effect measurements along multiple planes or points and in various forms and configurations.

Other configurations, as well as modifications, alternatives, omissions, refinements and substitutions will be apparent to those skilled in the art, as within the inventive scope, and although certain embodiments and descriptions have been provided, it is to be understood that various further configurations, modifications, alternatives, omissions, refinements and substitutions which depart from the disclosed exemplary embodiments may be adopted without departing from the spirit and scope of the invention.

What is claimed is:

1. A digitizing graphic system comprising a digitizing area, first and second hollow longitudinal coordinate arms extendable over said area, first and second magnetostrictive elements each positioned respectively in said first and second coordinate arms, means for magnetically biasing said magnetostrictive elements, positionable means movable with respect to said first and second arms on said area, each of said magnetostrictive elements having associated therewith a sending coil fixed with respect to the respective magnetostrictive element and a receiving coil encircling a respective magnetostrictive element and slidable therealong, said first arm including a first of said receiving coils, said second arm including a second of said receiving coils, energizing means coupled to each of said sending coils for inducing magnetostrictively a strain wave longitudinally propagating along said magnetostrictive element to said respective receiving coil, digitizing means coupled to each of said sending and receiving coils for digitizing the time duration of said strain wave propagation, said positionable means coupled to each of said coordinate arms for varying the propagating distance along each of said magnetostrictive elements in accordance with the position of said positionable means, means coupling said positionable means to said first receiving coil for imparting corresponding movement of said positionable means to said first receiving coil with respect to said first magnetostrictive element, and means coupling said first arm to said second receiving coil for imparting corresponding movement of said first arm to said second receiving coil with respect to said second magnetostrictive element.

2. The system of claim 1 wherein each of said sending and receiving coils includes a plurality of turns of a conductor encircling said magnetostrictive element.

3. The system of claim 1 wherein each of said magnetostrictive elements are terminated at at least one end thereof by means of a coil spring for providing tensile variation compensation to said magnetostrictive element.

4. The system of claim 1 wherein said positionable means is a drafting head and a receiving coil is movable by a rollably mounted means within a coordinate arm and coupled with respect to said drafting head so as to be movable therewith.

5. The system of claim 1 wherein each said coordinate arm includes a wheeled trolley for effecting movement of said receiving coil, and wherein said drafting head is movably coupled to one of said coordinate arms for effecting movement of said wheeled trolley associated therewith, and wherein said one of said coordinate arms is movably coupled to the other of said coordinate arms for effecting movement of said wheeled trolley associated therewith.

6. The system of claim 4 wherein said rollably mounted means includes an apertured plate, said magnetostrictive element passing through said aperture, said receiving coil including a coiled conductor mounted about said aperture, said plate having motion such that it moves within said coordinate arm and along said magnetostrictive element in accordance with the movement of said drafting head.

7. The system of claim 1 wherein a third coordinate arm is provided for digitizing, said arm upstanding from said drafting area and including a further magnetostrictive element, a further sending coils and a further receiving coil, means for varying the distance between said further sending and receiving coils in accordance with the distance of the dimension to be digitized, and further digitizing means coupled to said further sending and receiving coil for digitizing said distance as a third coordinate.

8. The system of claim 1 wherein a permanent magnet is positioned adjacent said sending coil.

9. The system of claim 1 wherein a permanent magnet is positioned adjacent said receiving coil.

10. A graphic digitizer comprising a drafting area, a first hollow longitudinal coordinate arm fixedly mounted to said drafting area, a second hollow longitudinal coordinate arm orthogonally positioned with respect to said first coordinate arm and movable thereon, a drafting head mounted to said second coordinate arm for movement in a direction orthogonal with respect to the movement of said second coordinate arm relative to said first coordinate arm, said drafting head thereby positionable along two axes over said drafting area, a first magnetostrictive element mounted within said first coordinate arm and strung along the length thereof, a first sending coil for inducing a strain wave into said first magnetostrictive element mounted to encircle one end of said first magnetostrictive element, a first mounting means slidably extending with respect to said first coordinate arm and mounted to said second coordinate arm for movement along said first magnetostrictive element in accordance with the movement of said second coordinate arm with respect to said first coordinate arm, a first receiving coil encircling said first magnetostrictive element and mounted on said first mounting means, a second magnetostrictive element mounted within said second coordinate arm and strung along the length thereof, a second sending coil for inducing a strain wave into said second magnetostrictive element mounted to encircle one end of said second magnetostrictive element, a second mounting means slidably extending with respect to said second coordinate arm and mounted to said drafting head for movement along said second magnetostrictive element in accordance with the movement of said drafting head with respect to said second coordinate arm, a second receiving coil encircling said second magnetostrictive element and mounted on said second mounting means, means for magnetically biasing said first and second magnetostrictive elements, means coupling each said mounting means to a receiving coil in each said respective coordinate arm for imparting corresponding movement of said positionable means to a respective receiving coil with respect to each magnetostrictive element, and means for digitizing the respective propagation times of said strain waves along said first and second magnetostrictive elements for digitizing the position of said drafting head relative to said drafting area.

11. The system of claim 10 wherein each of said sending and receiving means includes a plurality of turns of a conductor encircling said magnetostrictive element.

12. The system of claim 10 wherein each of said magnetostrictive elements are terminated at at least one end thereof by means of a coil spring for providing tensile variation compensation to said magnetostrictive element.

13. The system of claim 10 wherein said positionable means is a drafting head and a receiving means is movable by a rollably mounted means within a coordinate arm and coupled with respect to said drafting head so as to be movable therewith.

14. The system of claim 10 wherein each said mounting means includes a wheeled trolley within the respective coordinate arm for effecting movement of the respective said receiving coil, and wherein said drafting head is movably coupled to one of said coordinate arms for effecting movement of said wheeled trolley associated therewith, and wherein said one of said coordinate arms is movably coupled to the other of said coordinate arms for effecting movement of said wheeled trolley associated therewith.

15. The system of claim 14 wherein each said mounting means includes an apertured plate, the respective said magnetostrictive element passing through said aperture, each said receiving coil including a coiled conductor mounted about said aperture, said plate having motion such that it moves within the respective said coordinate arm and along said magnetostrictive element in accordance with the movement of said drafting head.

16. The system of claim 10 wherein a third coordinate arm is provided for digitizing, said arm upstanding from said drafting area and including a further magnetostrictive element, a further sending means and a further receiving means, means for varying the distance between said further sending and receiving means in accordance with the distance of the dimension to be digitized, and further digitizing means coupled to said further sending and receiving means for digitizing said distance as a third coordinate.

17. The system of claim 10 wherein a permanent magnet is positioned adjacent said sending coil.

18. The system of claim 10 wherein a permanent magnet is positioned adjacent said receiving coil.

19. A digitizing graphic system comprising a digitizing area, first and second coordinate arms extendable over said area, first and second magnetostrictive elements each positioned respectively in said first and second coordinate arms, positionable means movable with respect to said first and second arms on said area, each of said magnetostrictive elements having associated therewith a sending means and a receiving means, energizing means coupled to each of said sending means for inducing magnetostrictively a strain wave longitudinally propagating along said magnetostrictive element to said respective receiving means, digitizing means coupled to each of said sending and receiving means for digitizing the time duration of said strain wave propagation, said positionable means coupled to each of said coordinate arms for varying the propagating distance along each of said magnetostrictive elements in accordance with the position of said positionable means, each said sending means being fixed in a position at one end of a respective magnetostrictive element, each said receiving means being along the respective magnetostrictive element with respect to the sending means associated therewith, said positionable means comprising a drafting head, the receiving means being movable by a rollably mounted means within each coordinate arm and coupled with respect to said drafting head so as to be movable therewith, each said coordinate arm being a hollow member, said rollably mounted means being positioned within said hollow member and driven by means of a link coupled to said rollably mounted means, said rollably mounted means further including a wheeled platform coupled to said link, an apertured plate being coupled to said wheeled platform and driven thereby along said magnetostrictive element, said hollow member further including an upwardly extending member running along the internal length of said hollow member, and said apertured plate including a complementary shaped groove adapted to ride along the said upwardly extending member.

20. A graphic digitizer comprising a drafting area, a first coordinate arm fixedly mounted to said drafting area, a second coordinate arm orthogonally positioned with respect to said first coordinate arm and movable thereon, a drafting head mounted to said second coordinate arm for movement in a direction orthogonal with respect to the movement of said second coordinate arm relative to said first coordinate arm, said drafting head thereby positionable along two axes over said drafting area, a first magnetostrictive element mounted within said first coordinate arm and strung along the length thereof, a first sending coil for inducing a strain wave into said first magnetostrictive element mounted at one end of said first magnetostrictive element, a first receiving coil mounted to said second coordinate arm for movement along said first magnetostrictive element in accordance with the movement of said second coordinate arm with respect to said first coordinate arm, a second magnetostrictive element mounted within said second coordinate arm and strung along the length thereof, a second sending coil for inducing a strain wave into said second magnetostrictive element mounted at one end of said second magnetostrictive element, a second receiving coil mounted to said drafting head for movement along said second magnetostrictive element in accordance with the movement of said drafting head with respect to said second coordinate arm, and means for digitizing the respective propagation times of said strain waves along said first and second magnetostrictive elements for digitizing the position of said drafting head relative to said drafting area, each said coordinate arm including a wheeled trolley for effecting movement of said receiving coils, and wherein said drafting head is movably coupled to one of said coordinate arms for effecting movement of said wheeled trolley associated therewith, said one of said coordinate arms being movably coupled to the other of said coordinate arms for effecting movement of said wheeled trolley associated therewith, said rollably mounted means including an apertured plate, the respective said magnetostrictive element passing through said aperture, said receiving coil including a coiled conductor mounted about said aperture, said plate having a motion such that it moves within said coordinate arm and along said magnetostrictive element in accordance with the movement of said drafting head, said coordinate arm being a slotted member, said rollably mounted means being positioned within said slotted member and driven by means of a link coupled to said rollably mounted means and passing through the slot formed by said slotted member, said rollably mounted means further including a wheeled platform coupled to said link, said apertured plate being coupled to said wheeled platform and driven thereby, along said magnetostrictive element, said slotted member further including an upwardly extending member running along the internal length of said slotted member, and said apertured plate including a complementary shape groove adapted to ride along the said upwardly extending member.

* * * * *

UNITED STATES PATENT AND TRADEMARK OFFICE
CERTIFICATE OF CORRECTION

PATENT NO. : 3,956,588
DATED : May 11, 1976
INVENTOR(S) : Albert L. Whetstone, Stanley C. Phillips It is certified that error appears in the above-identified patent and that said Letters Patent are hereby corrected as shown below:

Column 1, line 66, after "present" insert --invention--.

Column 3, line 2, after "x and y" insert --axes--;

line 7, delete "place" and substitute --plane--

Column 6, line 40, delete "manner" and substitute --number--.

Column 10, line 52, after "The x" insert --latch--.

Column 11, line 44, delete "accordacne" and substitute --accordance--.

Column 14, line 1, delete "coils" and substitute --coil--.

Column 16, line 61, after "thereby" delete " , " .

Signed and Sealed this

Nineteenth Day of October 1976

[SEAL]

Attest:

RUTH C. MASON
*Attesting Officer*

C. MARSHALL DANN
*Commissioner of Patents and Trademarks*